United States Patent
Kim et al.

(10) Patent No.: US 6,668,343 B1
(45) Date of Patent: Dec. 23, 2003

(54) INTERLEAVING/DEINTERLEAVING DEVICE AND METHOD FOR COMMUNICATION SYSTEM

(75) Inventors: Min-Goo Kim, Suwon-shi (KR); Beong-Do Kim, Songnam-shi (KR); Young-Hwan Lee, Songnam-shi (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 09/468,568

(22) Filed: Dec. 21, 1999

(30) Foreign Application Priority Data

Dec. 21, 1998 (KR) .............................. 98-57959

(51) Int. Cl.[7] .............................................. G11C 29/00
(52) U.S. Cl. ....................................... 714/702; 714/763
(58) Field of Search ................................ 714/756, 762, 714/771, 702, 763; 331/78; 382/232

(56) References Cited

U.S. PATENT DOCUMENTS

| | | | | |
|---|---|---|---|---|
| 4,637,021 A | * | 1/1987 | Shenton ...................... | 714/756 |
| 4,875,021 A | * | 10/1989 | Sonetaka ..................... | 331/78 |
| 5,051,998 A | * | 9/1991 | Murai et al. ................. | 714/762 |
| 5,440,571 A | * | 8/1995 | Mok ........................... | 714/771 |
| 5,446,474 A | | 8/1995 | Wade et al. ................. | 343/915 |
| 5,446,747 A | | 8/1995 | Berrou ........................ | 371/45 |
| 6,111,986 A | * | 8/2000 | Sun ............................. | 382/232 |

FOREIGN PATENT DOCUMENTS

| | | |
|---|---|---|
| JP | 62-190932 | 8/1987 |
| JP | 06-216882 | 8/1994 |
| JP | 09-074361 | 3/1997 |
| JP | 09-102748 | 4/1997 |
| JP | 09-116444 | 5/1997 |

OTHER PUBLICATIONS

Japanese Office Action dated Sep. 17, 2002 issued in a counterpart application, namely, Appln. No. 2000–590308.

* cited by examiner

*Primary Examiner*—David Ton
(74) *Attorney, Agent, or Firm*—Dilworth & Barrese, LLP

(57) ABSTRACT

A method for interleaving input data having a size other than a multiple of $2^m$ (m>1) is disclosed. The method comprises sequentially storing input data in a memory; adding an offset value to the input data size to provide a virtual address having a size of $2^m$ where (m>1); defining a plurality of address generation areas each having a size of $2^m$ m where (m>1), and generating random addresses in the address generation areas; and reading the input data from the memory using the random addresses generated from the address generation areas.

21 Claims, 9 Drawing Sheets

INTERLEAVING/DEINTERLEAVING DEVICE AND METHOD FOR COMMUNICATION SYSTEM

BACKGROUND OF THE INVENTION

1. Field of the Invention

The present invention relates generally to an interleaving/deinterleaving device and method, and in particular, to an interleaving/deinterleaving device and method for a turbo encoder used in radio communication systems such as satellite, ISDN (Integrated Services Digital Network), digital cellular, W-CDMA (Wideband Code Division Multiple Access), IMT-2000 and W-ATM (Wideband Asynchronous Transfer Mode) communication systems.

2. Description of the Related Art

In a turbo encoder, interleaving is performed to randomize information input to the encoder and to improve the distance property of a codeword. In particular, it is expected that the turbo encoder will be used in a supplemental channel (or traffic channel) of an IMT-2000 (or CDMA-2000) communication system and in a data channel of UMTS (Universal Mobile Telecommunication System) proposed by ETSI (European Telecommunication Standards Institute). Thus, a method for embodying an interleaver for this purpose is required. In addition, the use of turbo encoders results in an increase in the reliability of a digital communication system, and in particular, to a performance improvement of existing and future digital mobile communication systems.

The turbo encoder encodes an input frame of L information bits into parity symbols using two simple parallel concatenated codes, wherein recursive systematic convolutional (RSC) codes are typically used for component codes.

FIG. 9 shows a common turbo encoder, which is disclosed in detail in U.S. Pat. No. 5,446,747, issued on Aug. 29, 1995, which is hereby incorporated by reference.

Referring to FIG. 9, the turbo encoder includes a first component encoder 11 for encoding input frame data, an interleaver 12 for interleaving the input frame data, and a second component encoder 13 for encoding an output of the interleaver 12. A known RSC encoder is typically used for the first and second component encoders 11 and 13. Further, the interleaver 12 has the same size as the input information bit frame, and rearranges the sequence of the information bits provided to the second component encoder 13 to reduce a correlation between the information bits.

For the internal interleaver (or a turbo interleaver) 12 of the turbo encoder, there are proposed various interleavers such as PN (Pseudo Noise) random interleaver, random interleaver, block interleaver, non-linear interleaver, and S-random interleaver. However, so far, such interleavers are mere algorithms designed to improve their performances in terms of scientific researches rather than implementation. Therefore, when implementing an actual system, the hardware implementation complexity must be taken into consideration. A description will now be made of properties and problems associated with the conventional interleaver for the turbo encoder.

Performance of the turbo encoder is dependent upon the internal interleaver. In general, it is not possible to design an interleaver guaranteeing an optimal performance because an increase in interleaver size causes a geometric increase in calculations. Therefore, in general, the interleavers are implemented by determining conditions satisfying several given criteria. The criteria are as follows:

Distance Property: The distance between adjacent codeword symbols should be maintained to a certain extent. Since this has the same function as a codeword distance property of the convolutional code, it is preferable that the interleaver should be designed to have the longer distance, if possible.

Weight Property: A weight of a codeword corresponding to a non-zero information word should be higher than a threshold value. Since this has the same function as the minimum distance property of the convolutional code, it is preferable that the interleaver should be designed to have the greater weight, if possible.

Random Property: A correlation factor between output word symbols after interleaving should be much lower than a correlation factor between original input word symbols before interleaving. That is, randomization between the output word symbols should be completely performed. This makes a direct effect on the quality of extrinsic information generated in continuous decoding.

Although the above three design criteria are applied to the turbo interleaver, the properties are not definitely analyzed. According to experiments, the random interleaver is superior in performance to the block interleaver. However, the random interleaver is disadvantageous in that an increase in the variety and size of the frame causes an increase in the required memory capacity for storing an interleaver index (i.e., mapping rule or address). Therefore, taking the hardware size into consideration, it is preferable to employ an enumeration method for reading data stored at a corresponding address by generating an address at every symbol clock using an index generating rule rather than a look-up table method for storing the interleaver index.

In conclusion, when various interleaver sizes are required and the hardware implementation complexity is limited in the IMT-2000 or UTMS system, the turbo interleaver should be designed to guarantee the optimal interleaver performance by taking the limitations into consideration. That is, it is necessary to define an address generating rule and then perform interleaving/deinterleaving according to the address generating rule. Of course, the interleaver should be designed to completely satisfy the above stated turbo interleaver's properties.

The IMT-2000 or UMTS specification has not yet given any definition to the turbo interleaver. The forward link and the reverse link defined by the IMT-2000 specification have various types of logical channels and various interleaver sizes. Therefore, in order to meet this variety requirement, there is required an increase in memory capacity. For example, in a N=3 forward link transmission mode, an interleaver of various sizes ranging from 144 bits/frame to 36864 bits/frame may be used.

To sum up, the prior art has the following disadvantages.

First, for the conventional internal interleaver of the turbo encoder, PN random interleavers, random interleavers, block interleavers, non-linear interleavers, and S-random interleavers may be used. However, such interleavers are mere algorithms designed to improve their performances in terms of scientific researches rather than implementation. Therefore, when implementing an actual system, the hardware implementation complexity of such interleavers must be considered. However, this is not specifically defined.

Second, since a controller (CPU or host) of the transceiver should store interleaving rules according to the respective interleaver sizes in the existing interleaving method using a look-up table, a host memory requires a separate capacity in addition to an interleaver buffer. That is, when the frame size becomes varies and increases in size, an increased memory capacity for storing the interleaver index (i.e., mapping rule or address) is required.

Third, it is not easy to implement an interleaver satisfying both the distance property and the random property.

Fourth, a detailed turbo interleaver design specification for the turbo encoder of the CDMA-2000 forward link is not established yet.

SUMMARY OF THE INVENTION

It is, therefore, an object of the present invention to provide a device and method for implementing an interleaver which can solve the problems of the conventional interleaver.

It is another object of the present invention to provide an interleaving/deinterleaving device and method satisfying all the properties of a turbo encoder, including the distance property, weight property and random property, in a communication system.

It is further another object of the present invention to provide a device and method for performing interleaving using a virtual address area having a size of $2^m \times N$ (where N is an integer, and M is larger than 1 and equal to the number of shift registers) by adding a specific value to an input data size value, in a communication system.

To achieve the above objects, there is provided a method for interleaving input data having a size other than multiples of $2^m$ (m>1). The method comprises sequentially storing input data in a memory; adding an offset value to the input data size to provide a virtual address having a size of $2^m$; defining a plurality of address generation areas each having a size of $2^m$, generating random addresses in the address generation areas; and reading the input data from the memory using the random addresses generated from the address generation areas.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Figure 1:
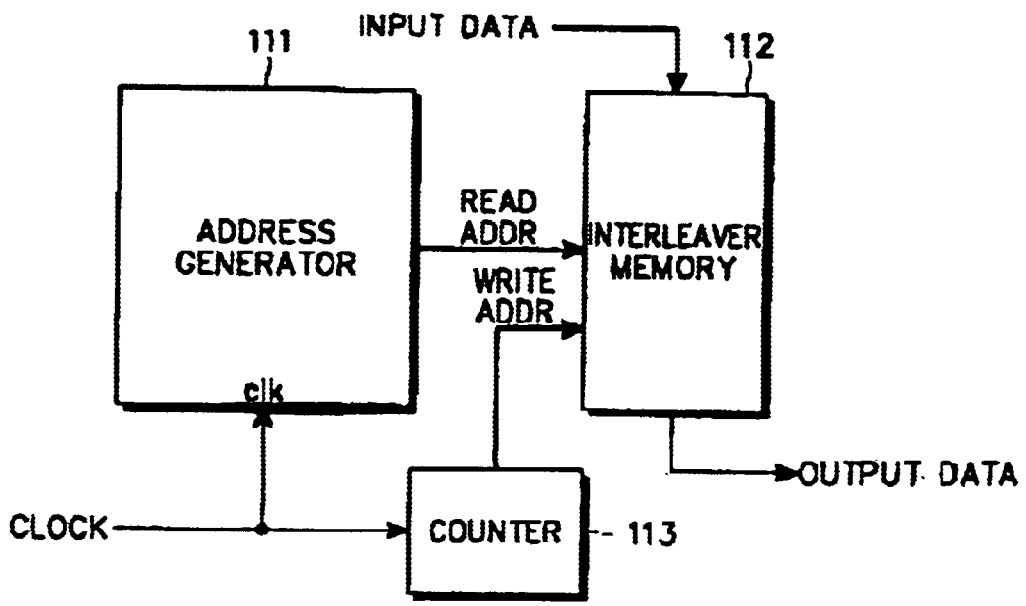
FIG. 1 is a block diagram illustrating an interleaving device in a communication system according to an embodiment of the present invention.

A preferred embodiment of the present invention will be described herein below with reference to the accompanying drawings. In the following description, well-known functions or constructions are not described in detail since they would obscure the invention in unnecessary detail.

The invention proposes an optimal interleaving/deinterleaving device satisfying properties (including distance property, weight property and random property) of the turbo interleaver.

To this end, if the size of the input frame data is not a multiple of $2^m$ (m>1), an address generator of the novel turbo interleaver adds OSV(offset value) which is a certain value, such that the number of consecutive zero bits from the LSB becomes one among from 1 to 64 when the frame size is expressed as a binary value, in order to determine a virtual address size N. In order to express the determined virtual address size N in terms of $Ng \times 2^m$, an area number Ng and a value 'm' are determined through experiments to optimally satisfy the interleaver properties. Thereafter, a PN address is generated according to partial address generation areas of size $2^m$ to interleave the whole input frame data. For example, when the frame size is 376 (=101111000), an offset value which can be added such that the number of consecutive zero bits from the LSB becomes the certain value is 8 (=1000).

Here, unnecessary read addresses are generated due to the added offset values, and these addresses are referred to as invalid addresses. If the offset value is added to the input data size value such that the input frame should be expressed in terms of power of 2, an increase in the size of the input frame causes a great increase of the size of the offset value thereby making it difficult to process the invalid address. Further, an increase in area number may cause deterioration of the random property. The term "area" as used herein refers to each address generation area when an interleaving address area is uniformly divided, and the term "group" refers to an address area grouped by the offset values.

The interleaver according to the present invention permutes the sequence of input information bits using a PN offset controlled method and provides the permuted information bits to the second component encoder. Therefore, an interleaving according to the present invention requires an interleaver memory (comprised of an input data buffer and an output data buffer) for storing input information bits, an offset controlled PN interleaving (OCPNI) block (comprised of a partial reversal interleaver and a comparator) for finally changing the sequence of the input information bits, and an up/down counter. In addition, for the first and second component encoders, the turbo encoder can use not only the conventional component encoder, but also a component encoder specified by the CDMA-2000 system and a component encoder specified by the UMTS system. Further, the interleaver according to the present invention can be applied to not only an internal interleaver of a serial turbo encoder but also a channel interleaver.

Figure 2:
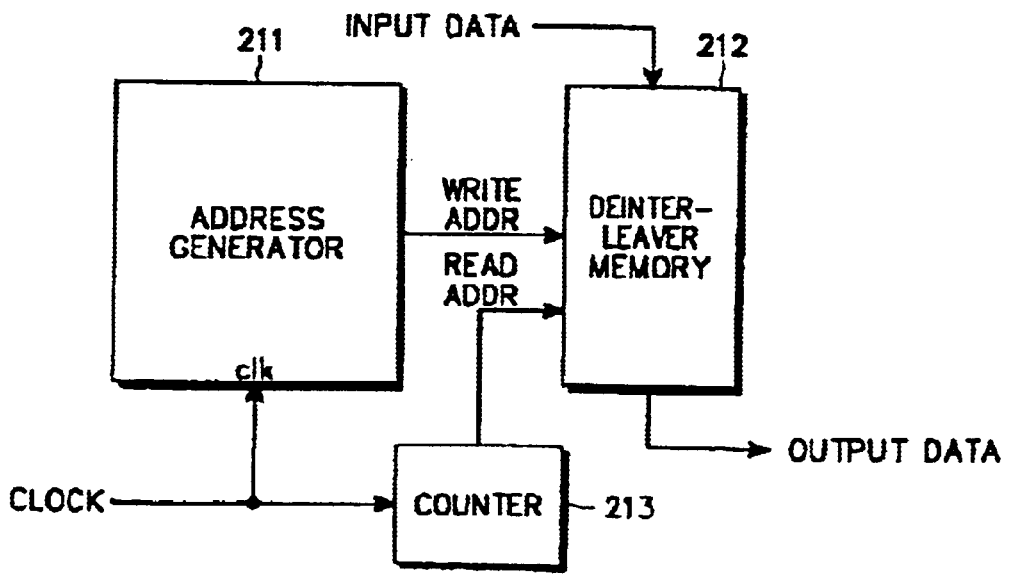
FIG. 2 is a block diagram illustrating a deinterleaving device in a communication system according to an embodiment of the present invention.

FIGS. 1 and 2 show an interleaver and a deinterleaver according to an embodiment of the present invention, respectively.

Referring to FIG. 1, an interleaver for interleaving frame data output from the first component encoder will be described. An address generator 111 generates a read address for changing the sequence of input data bits according to an input frame data size L and an input clock, and provides an interleaver memory 112 with the generated read address. The interleaver memory 112 sequentially stores input data in a write mode of operation, and outputs the stored data according to the read address provided from the address generator 111 in a read mode of operation. A counter 113 counts the input clock and provides the clock count value to the interleaver memory 112 as a write address. As describe above, the interleaver sequentially stores input data in the interleaver memory 112 in the write mode of operation, and outputs the data stored in the interleaver memory 112 according to the read address provided from the address generator 111 in the read mode of operation. Alternatively, it is also possible to change the sequence of the input data bits before storing them in the interleaver memory in the write mode of operation, and sequentially read the stored data in the read mode of operation.

Referring to FIG. 2, a deinterleaver will be described. An address generator 211 generates a write address for restoring the sequence of input data bits to the original sequence according to an input frame data size L and an input clock, and provides a deinterleaver memory 212 with the generated write address. The deinterleaver 212 stores input data according to the write address provided from the address generator 211 in the write mode of operation, and sequentially outputs the stored data in the read mode of operation. A counter 213 counts the input clock and provides the clock count value to the deinterleaver memory 212 as a read address.

As described above, the deinterleaver has the same structure as the interleaver and has the reverse operation of the interleaver. The deinterleaver is merely different from the interleaver in that the input data has different sequences in both the read and write modes. Therefore, for convenience, the description below will now be made with reference to the interleaver only.

It is preferable to derive a conclusion through a great number of simulations in order to implement an interleaver having excellent structural properties. In general, when the frame size is larger than a given value, a random interleaver has average performance. Therefore, it is preferable to design an interleaver having a similar performance to the random interleaver. To this end, the embodiment of the present invention uses a linear feedback shift register (LFSR) which generates a PN sequence, and uses a random address generated therefrom. However, this method has several problems, namely, the PN sequence has a period of $2^m-1$, and most frame sizes are not expressed in terms of power of 2.

To solve these problems, a read address is generated by adding the offset value (OSV) to the input data size L when the input data size L is not a multiple of $2^m$ (m>1) in order to determine a virtual address size N in accordance with an algorithm of Equation (1) below.

Now, a description will be made of a software interleaving method according to an embodiment of the present invention. When the input data size L is not a multiple of $2^m$ (m>1), a virtual address size N is calculated by adding the offset value OSV to the input data size L, and interleaving is performed by an offset controlled PN interleaving algorithm of Equation (1).

[Equation 1]

```
{N=L+OSV;
/*Find N=2^m×Ng*/
for(ADDRESS_WRITE=0;ADDRESS_WRITE<=2^m-2;
ADDRESS_WRITE++)
{for(g=0;g<=Ng-1;g++)
{ADDRESS_READ=[PNg(ADDRESS_WRITE)-1]+g*2^m;
if(ADDRESS_READ<=L-1) {
ADDRESS_READ=ADDRESS_READ-OFFSET(ADDRESS_READ); }
}
}
/*Overwrite ADDRESS_READ with the same address as
ADDRESS_WRITE*/
for(g=0;g<=Ng-1;g++)
{ADDRESS_WRITE=2^m-1;
ADDRESS_READ=ADDRESS_WRITE+g*2^m-OFFSET
(ADDRESS_WRITE);}
/*OFFSET Generation Algorithm*/
function OFFSET(ADDRESS_READ)
{
if(ADDRESS_READ<GTH[0]OFFSET=0;
else if(GTH[0]<ADDRESS_READ<GTH[1])OFFSET=1;
else if(GTH[1]<ADDRESS_READ<GTH[2])OFFSET=2;
else if(GTH[2]<ADDRESS_READ<GTH[3])OFFSET=3;
else if(GTH[3]<ADDRESS_READ<GTH[4])OFFSET=4;
else if(GTH[4]<ADDRESS_READ<GTH[5])OFFSET=5;
else if(GTH[5]<ADDRESS_READ<GTH[6])OFFSET=6;
else OFFSET=7;
}
}
```

The read address ADDRESS_READ generated by the algorithm of Equation (1) is mapped with the original address on a one-to-one basis. Such an interleaver has the distance property as well as the PN interleaver's property. In Equation (1), OFFSET(I) is a function of determining to which group the ADDRESS_READ belongs using thresholds determined by the offset value, and then shifting the address by the corresponding specific value.

Figure 3:
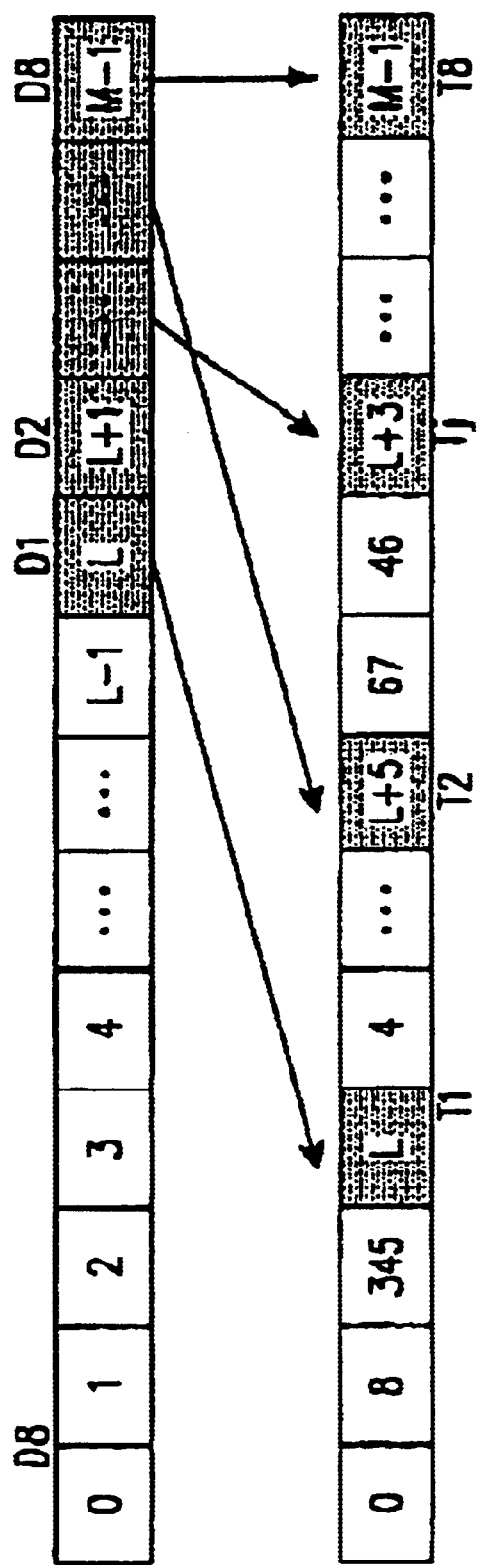
FIG. 3 is a diagram illustrating that the invalid symbols interleaved according to an offset value exist between interleaved symbols in case of interleaving with a virtual address area in which the offset value is added to input data.

If data is read by addressing the corresponding address of the interleaver memory without shifting the address by the specific value, invalid data will be read due to the offset value. That is, in addition to the ADDRESS_READ corresponding to the input data of [0 . . . L-1], there exist 8 ADDRESS_READs corresponding to the offset [L . . . N-1] between the interleaving sequences. This is shows in FIG. 3. If those are read as they are, N symbols which are higher in number by 8 than L symbols to be actually transmitted will be transmitted. Therefore, the succeeding address should be connected after removing the address existing between the interleaving sequences. This is illustrated in FIG. 4.

Figure 4:
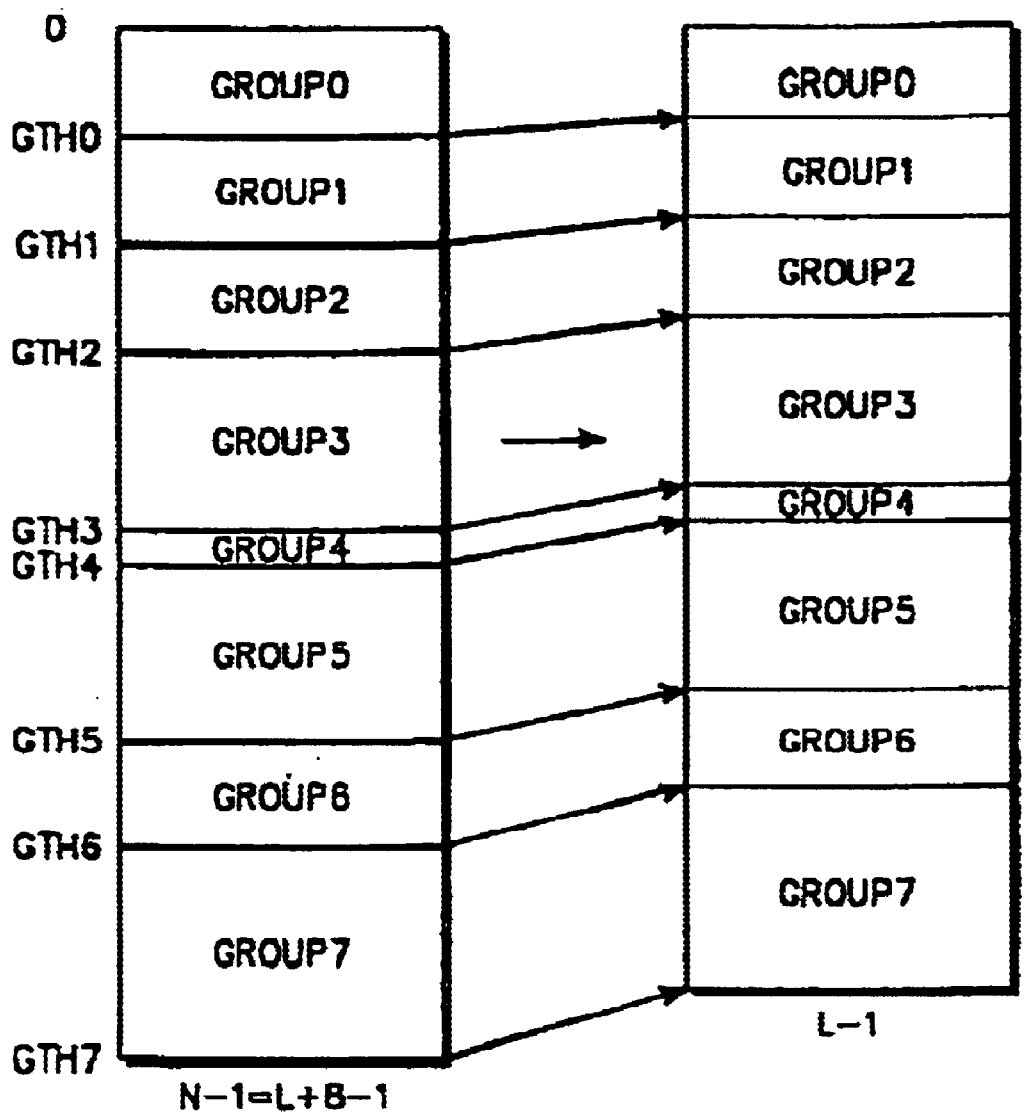
FIG. 4 is a diagram illustrating a connection of the output symbols after removing the invalid symbols of FIG. 3.

Referring to FIG. 4, the invalid symbols from L to N-1 exist between the interleaved sequences. Therefore, it is necessary to output the interleaved symbols in succession except for the invalid symbols. For this, an offset controlled method is used. That is, ADDRESS_READ corresponding to the last 8 symbols out of [L . . . N-1] are regularly determined according to an interleaving rule. Therefore, it is possible to previously know the positions of the interleaved invalid symbols. First, assume that addresses for 8 tail symbols are D1, D2, D3, . . . , D8 (i.e., L . . . N-1), and an interleaving address corresponding to Di (i=1 . . . 8) is Tk=PIRB(Di), where k=1 . . . 8. Of course, it is not always that T1<T2 for D1<D2, and the interleaving address is arranged in a given order. Therefore, for convenience, assume that an index controlled to arrange the interleaving address in order of T1<T2<. . . <T8 is defined as 'j' and an address using this is defined as Tj (j=1 . . . 8). Then, the N interleaving areas are divided into 8 groups on the basis of the above address, and each Ti becomes a threshold for distinguishing a boundary thereof. Here, the addresses should be connected except the threshold values. For example, by subtracting '0' from ADDRESS_READ (i.e., ADDRESS_READ-0) for G0, ADDRESS_READ-1 for G1, . . . , and ADDRESS_READ-7 for G7, all the generated addresses will have the values among [0. . . L−1].

Figure 5:
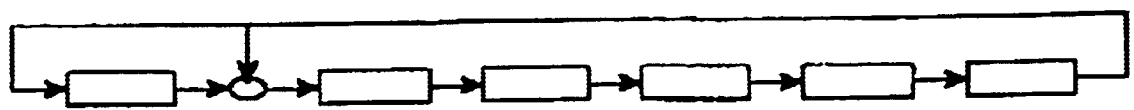
FIG. 5 is a diagram illustrating a PN generator having a generator polynomial of $(1+x+x^6)$.

In addition, before applying the algorithm of Equation (1), several parameters should be previously determined. The parameters described below were determined through experiments. Such parameters are variable depending on initial seeds of a PN generator for generating a PN sequence, but have nothing to do with the performance of the interleaver. Therefore, the initial seeds are fixed to predetermined values. In Tables 1 and 2 below, p(x) is a primitive polynomial of the PN generator determined on a Galois field GF(2), wherein the leftmost bit indicates a coefficient of 0th degree and the rightmost bit indicates a coefficient of the highest degree. That is, p(x)=[1100001] indicates p(x)=1+x+$x^6$. A PN generator corresponding to the generator polynomial p(x)=1+x+$x^6$ is illustrated in FIG. 5.

Figure 6:
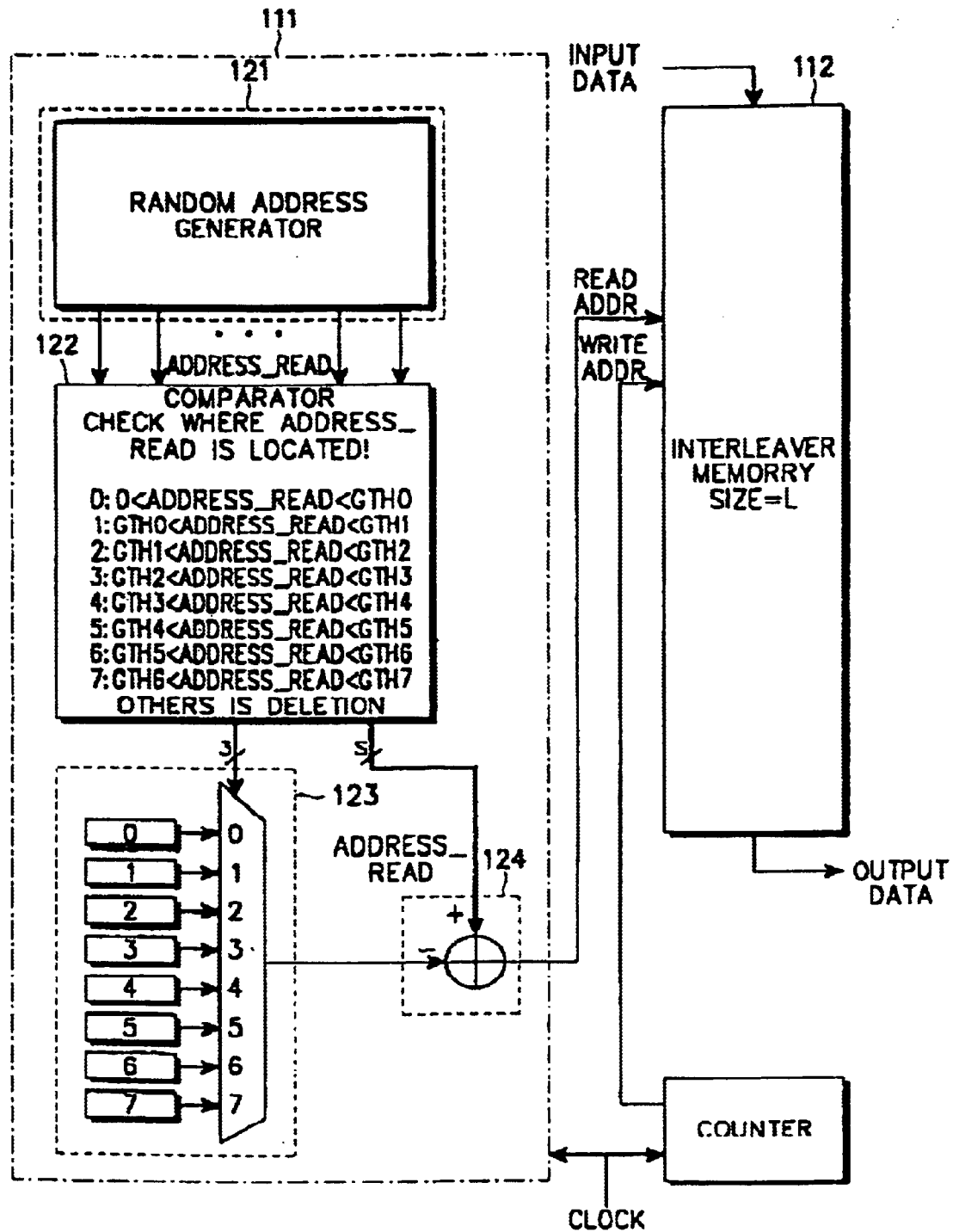
FIG. 6 is a block diagram illustrating a unit for generating an interleaving read address according to an embodiment of the present invention.

In general, in the initialization process, the initial seeds corresponding to the respective areas are loaded on m shift register cells. Thereafter, the register values are updated every clock by the connected line, and after update, a 6-bit address is generated by the combination of the values (0/1) stored in the register. That is, when the content of the lowest degree is p[1] and the content of the highest degree is p[m], $PN_g$(ADDRESS_WRITE) indicates an address obtained by converting the shift register's binary value of (p[1]p[2]. . . p[m−1]p[m]) to a decimal number (=p[1]$2^{m-1}$+. . . +p[m]$2^0$) when clocking is performed at an initial time by write address ADDRESS_WRITE. In addition, the address generated from the PN generator has a period of $2^m$−1. Further, since the initial seeds are not zero, all the generated addresses have the vales within a range of {1≦k≦$2^m$−1}. Therefore, [$PN_g$(ADDRESS_WRITE)—1] has the value within the range of {0≦k≦$2^m$−2}. In this case, since the number, $2^m$−1, of the addresses generated by the PN generator is smaller by one than the number, $2^m$, of the required addresses, the last address in every area is overwritten and then used as the ADDRESS_READ. In Equation (1), this relation is expresses as follows:

ADDRESS_WRITE=ADDRESS_WRITE+g*$2^m$-OFFSET(ADDRESS_WRITE);

Now, a description will be made of a hardware implementation of the algorithm of Equation (1). FIG. 6 shows the detailed structure of the address generator for reading the data sequentially stored in the interleaver memory 112 according to an embodiment of the present invention.

Referring to FIG. 6, the address generator 111 will be described. A random address generator 121 outputs random addresses generated by a plurality of PN generators. A comparator 122 compares the random addresses output from the random address generator 121 with the threshold values GTH (threshold values for grouping the address areas) previously determined by the offset value, to output a group value select signal and the random addresses. Further, when the comparator 122 compares the random addresses output from the random address generator 121 with group threshold values GTH determined by the offset value, and when any one of them is identical, the comparator 122 deletes the random address at that time. A selector 123 selects a group value according to the select signal. A subtracter 124 subtracts a specific group value of the selector 123 from the random address output from the comparator 122, in order to generate a read address for reading data from the interleaver memory 112.

Figure 7A:
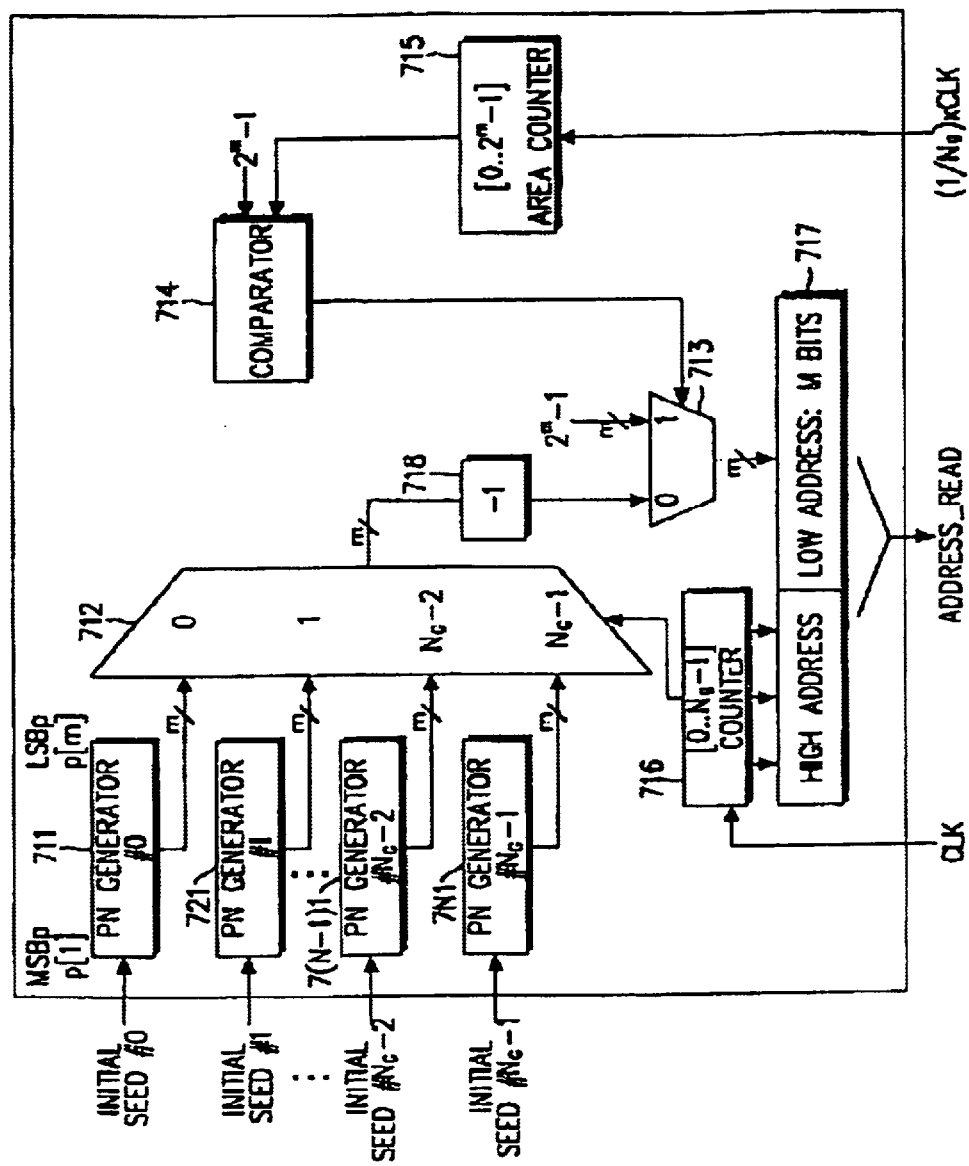
FIG. 7A is a detailed block diagram of the random address generator shown in FIG. 6.

A detailed structure of the random address generator 121 is illustrated in FIG. 7A. Referring to FIG. 7A, PN generators 711–7N1 generate PN sequences for changing the sequence of data bits stored in the corresponding address generation areas, and provide the generated PN sequences to a first multiplexer 712. Here, the PN generators 711–7N1 each are initialized to different values. A counter 716 outputs select signals for selecting an output of the first multiplexer 712. If it is assumed that the address area number is Ng, the counter 716 outputs select signals of 0. . . Ng-1. Here, the select signals can be generated either sequentially or randomly. For random generation, the select signals are randomly generated according a given pattern determined through experiments. The first multiplexer 712 selects the outputs of the PN generators 711–7N1 according to the select signals provided from the counter 716. Here, output data of the first multiplexer 712 is subtracted by 1 at a subtractor 718 and then applied to a second multiplexer 713. This is to map the random addresses from '0' by subtracting '1' from all the generated values, since the PN generators 711–7N1 cannot generate an address value of '0'. An area counter 715 generates a count value corresponding to the address generation area size, and provides a comparator 714 with the generated count value. The comparator 714 provides the second multiplexer 713 with a select signal '1' when a count value provided from the area counter 715 corresponds to an area size $2^{m-1}$. The second multiplexer 713 selects the output of the first multiplexer 712 when the count value generated by the area counter 715 according to the select signal corresponds to an area size-2, and selects the output of the area size $2^m$−1 (area size-1) provided from the comparator 714 when the count value generated by the area counter 715 reaches the area size-1. An address buffer 717 stores output data of the counter 716 in an upper address area, and stores output data of the second multiplexer 713 in a lower address area. The address stored in the read address buffer 717 is provided to the comparator 122 of FIG. 6. The comparator 122 then determines to which group the address belongs, and provides the corresponding group select signal to the selector 123. The selector 123 selectively outputs the group values according to the select signal, and the subtracter 124 subtracts the selected group value from the address output from the comparator 122 and provides the interleaver memory 112 with a final read address in order to read data corresponding to the read address from the interleaver memory 112.

Now referring to FIGS. 6 and 7A, a description will be made of a procedure for generating a read address. The PN generators 711–7N1 generate PN sequences by shifting stored state values using the clock, and the first multiplexer 712 selects the state values of the PN generators 711–7N1 according to the select signal provided from the counter 716. After selecting the state values, the PN generators 771–7N1 generate the PN sequences again by shifting stored state values using the clock. The PN sequence output from the first multiplexer 712 is subtracted by '1' and then provided to the second multiplexer 713. The PN sequence is provided to the lower area of the address buffer 717 before the area count value 1/NgxCLK reaches the address generation area size $2^m$−1. Meanwhile, when the area count value 1NgxCLK reaches the address generation area size value $2^m$−1, the value $2^m$−1 is provided to the lower area of the address buffer 717. Further, in the upper area of the address buffer 717, are stored the vales indicating the area (an address generation area corresponding to the presently selected PN generator), output from the counter 716. The address stored in the address buffer 717 is provided to the comparator 122, which determines to which group the address belongs and provides the corresponding group select signal to the selector 123. The address is then output to the subtracter 124. The selector 123 then selectively outputs the corresponding group value according to the select signal, and the subtracter 124 subtracts the corresponding group value from the address value output from the comparator 124 and provides the read address to the interleaver memory 112. Meanwhile, when there is no group to which the address belongs, i.e., when the address corresponds to the threshold values by the offset value, the comparator 122 deletes the address and regards the address as an invalid address. The interleaver memory 112 then outputs the data stored in the corresponding address according to the provided read address.

In this embodiment, the invalid address GTH generated by the offset values is deleted in the comparator 122. However, as an alternative embodiment, there is a method for not originally selecting the PN sequence corresponding to the offset value generated from the last PN generator 7N1. In this case, the delete function of the comparator 122 is unnecessary.

Figure 7B:
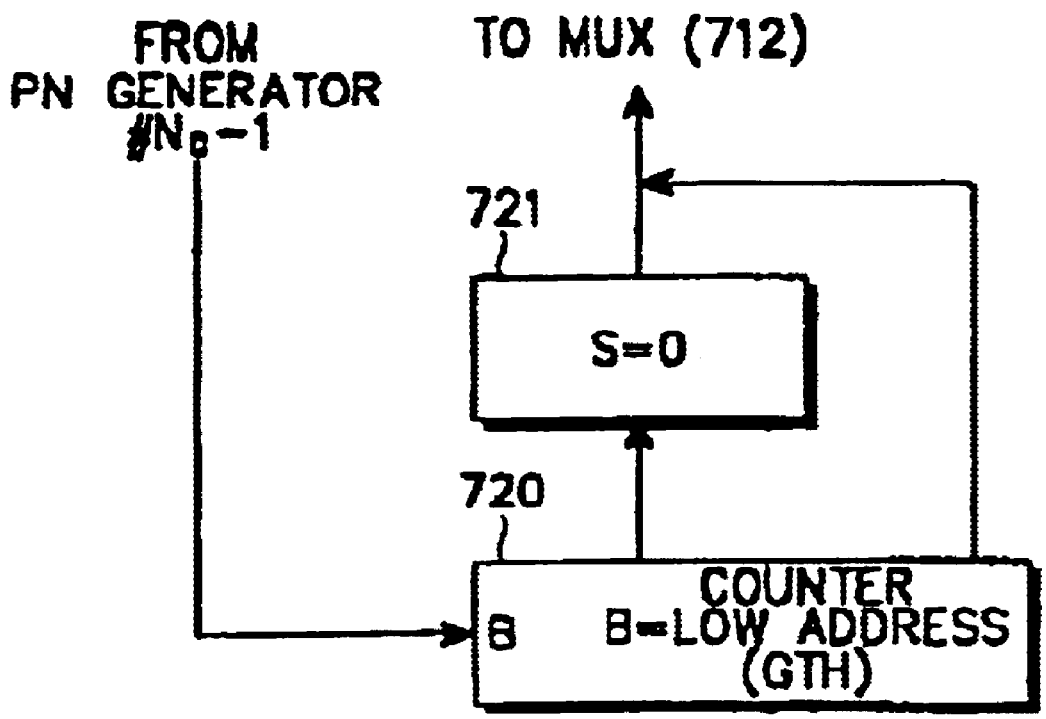
FIG. 7B is a diagram illustrating another example of a counter 716 in the random address generator of FIG. 7A.

Referring to FIG. 7B, a counter 720 monitors the state value of the last PN generator 7N1, and when it is determined that the state value is an invalid value by the offset value, the counter 720 outputs an enable signal to the selector 721. The selector 721 then provides the multiplexer 712 with a select signal (s=0) for selecting the first PN generator. When the PN generators are sequentially selected, the selector 721 outputs a select signal of '0', and when the PN generators are selected at random, the selector 721 outputs a select signal for selecting the next PN generator. That is, generation of the invalid address is avoided by not originally selecting an invalid value by the offset value generated from the last PN generator.

Figure 8:
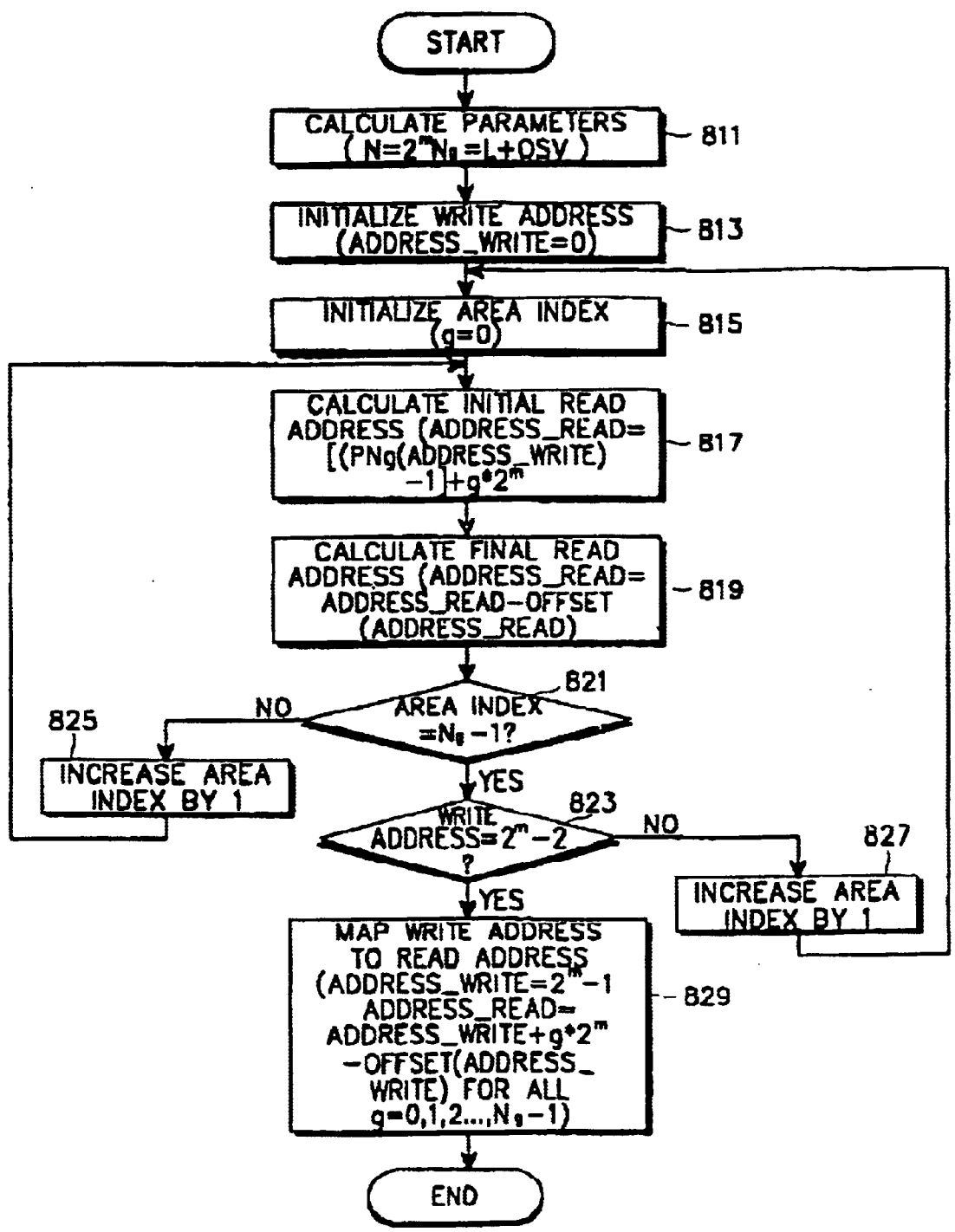
FIG. 8 is a flow chart illustrating a procedure for generating an interleaving read address according to an embodiment of the present invention.
Figure 9:
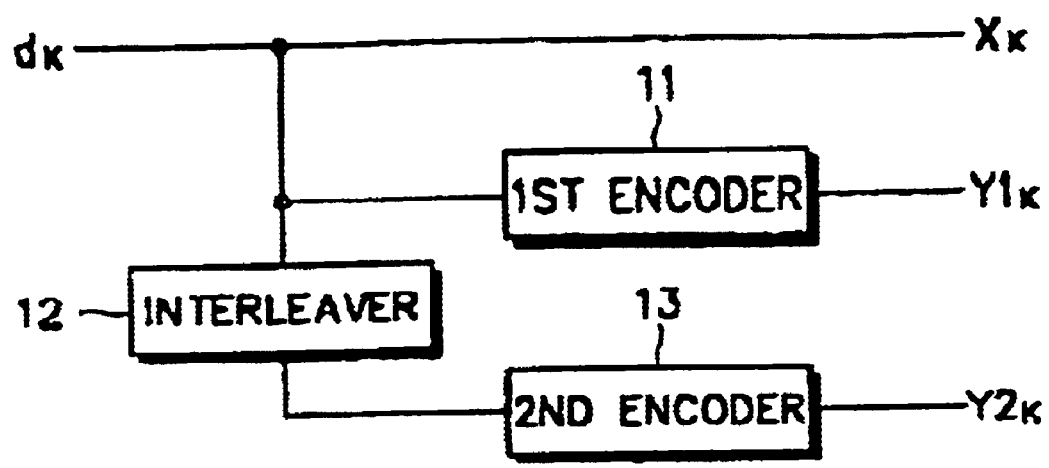
FIG. 9 is a block diagram of a turbo encoder according to the Prior Art.

FIG. 8 shows a procedure for generating an interleaving address based on the algorithm of Equation (1). Referring to FIG. 8, the address generator (or CPU) 121 calculates respective parameter values for interleaving in step 811. When an input frame size L is expressed as a binary value, the address generator 121 determines a virtual address size N by adding a certain value (or offset value) so that the number of consecutive zero bits from the LSB becomes the certain value. Further, when the virtual address size N is expressed in terms of a power of 2 (i.e., $2^m \times Ng$), the multiplier 'm' and the area number Ng are determined through experiments. The parameters are determined in the design process, and stored in a look-up table. During interleaving, the values are read from the look-up table.

Thereafter, the address generator 121 initializes the write address ADDRESS_WRITE to '0' in step 813, and initializes an area index 'g' to '0' in step 815. After initialization, in step 817, the address buffer 121 generates a random address using a PN sequence in accordance with an equation of ADDRESS_READ=[(PNg(ADDRESS_READ_WRITE)−1]+g*$2^m$, where PNg(ADDRESS_READ_WRITE) denotes a function for generating a PN sequence, and subtracting '1' therefrom maps the generated PN sequence from '0'. Further, adding 'g*$2^m$' maps the generated PN sequence to the respective areas. That is, for the area index g=0, the generated PN sequence is mapped to an area 0, and for the area index g=1, the generated PN sequence is mapped to an area 1.

In step 819, the address generator 121 generates the final read address using the calculated random address in accordance with an equation of (ADDRESS_READ= ADDRESS_READ-OFFSET(ADDRESS_READ). The above equation indicates that the read address is calculated by determining to which group the read address belongs and then subtracting an offset value corresponding to the group. Here, the group is distinguished by the group threshold value (i.e., invalid address) generated by the offset value. For example, when the read address corresponds to a group 1, the address generator 121 subtracts '1' from the final read address. Otherwise, when the read address corresponds to a group 2, the address generator 121 subtracts '2' from the final read address.

Thereafter, in step 821, the address generator 121 examines whether the area index g has reached the area number Ng-1. When it is judged that the area index has reached the area number-1, the address generator 121 proceeds to step 823. Otherwise, when the area index has not reached the area number Ng-1, the address generator 121 proceeds to step 825 to increase the area index by '1' and return to step 817.

Upon detecting that the area index has reached the area number Ng-1, the address generator 121 examines in step 823 whether the write address ADDRESS_WRITE has reached to a value $2^m-2$ (i.e., the number of addresses that one PN generator can generate). Here, the write address corresponds to the area count. When it is determined that the write address has reached the value $2^m-2$, the address generator 121 goes to step 829. Otherwise, when the write address has not reached the $2^m-2$, the address generator 121 proceeds to step 827 to increase the write address by '1' and return to step 815.

Upon detecting that the write address has reached the value $2^m-2$, the address generator 121 maps the write address to the read address using an equation of ADDRESS_WRITE=$2^m-1$, ADDRESS_READ= ADDRESS_WRITE+g*$2^m$−OFFSET(ADDRESS_WRITE) in step 829, and then ends the program. That is, the last write address is used as a read address.

Tables 1 and 2 below show OCPNI design parameters for each rate set when the novel interleaving scheme as applied to the IMT-2000 system.

TABLE 1

| Rate Set 1 | @12.2 Kbps | 38.4 Kbps | 76.8 Kbps | 153.6 Kbps | 307.2 Kbps |
| --- | --- | --- | --- | --- | --- |
| Frame Size L | 376 | 760 | 1528 | 3064 | 6136 |
| Offset Value(OSV) | 8 | 8 | 8 | 8 | 8 |
| N=L+OSV | 384 | 768 | 1536 | 3072 | 6144 |
| m | 6 | 7 | 8 | 9 | 10 |
| Ng | 6 | 6 | 6 | 6 | 6 |
| Initial | 101011 | 1010110 | 10101101 | 101011010 | 1010110101 |
| Parameter | 010100 | 0101001 | 01010010 | 010100101 | 0101001010 |
|  | 111011 | 1110110 | 11101101 | 111011010 | 1110110101 |
|  | 101111 | 1011111 | 10111110 | 101111101 | 1011111010 |
|  | 011101 | 0111010 | 01110101 | 011101010 | 0111010101 |
|  | 011010 | 0110101 | 01101010 | 011010101 | 0110101010 |

TABLE 1-continued

| Rate Set 1 | @12.2 Kbps | 38.4 Kbps | 76.8 Kbps | 153.6 Kbps | 307.2 Kbps |
|---|---|---|---|---|---|
| GTH {t0,t1,t2,t3, t4,t5,t6,t7} | {23,41,65,107,119 131,269,383} | {47,77,191,335,401, 425,641,767} | {491,599,737,755,1 187,1211,1265, 1535} | {659,1373,2027, 2447,2531,2825, 2861,3071} | {881,2159,2429, 2807,4307,4559, 4931,6143} |
| PN generator Polynomial p(x) | 1100001 | 10010001 | 101110001 | 1000100001 | 10010000001 |

TABLE 2

| Rate Set 2 | 28.8 kbps | 57.6 kbps | 115.2 kbps | 230.4 kbps | 460.8 kbps |
|---|---|---|---|---|---|
| Frame Size L | 568 | 1144 | 2296 | 4600 | 9208 |
| Offset Value(OSV) | 8 | 8 | 8 | 8 | 8 |
| N=L+OSV | 576 | 1152 | 2304 | 4508 | 9216 |
| M | 6 | 7 | 8 | 9 | 10 |
| Ng | 9 | 9 | 9 | 9 | 9 |
| Initial Parameter | 101011 010100 101010 011011 001011 111100 110111 100011 110000 | 1010110 0101001 1010100 0110111 0010110 1111001 1101110 1000111 1100000 | 10101101 01011101 10101001 01101110 00101101 11110010 11011101 10001110 11000001 | 101011010 010100101 101010010 001011010 001011010 111100101 110111010 100011101 110000010 | 1010110101 0101001010 1010100101 0110111010 0010110101 1111001010 1101110101 1000111010 1100000101 |
| GTH {t0,t1,t2,t3,t4 t5,t6,t7} | {107,305,332,368, 431,449,467,575} | {179,224,395,611, 710,746,1070,1151} | {485,647,854, 881,1529,1565, 1646,2303} | {197,323,764,818,2 144,3185,4166 4607} | {2006,2384,2942, 6074,7991,8396, 8963,9215} |
| PN generator polynomial p(x) | 1100001 | 10010001 | 101110001 | 1000100001 | 10010000001 |

Table 3 below shows OCPNI read addresses for an interleaver having a size of N=376 and generated based on Table 1

In addition, the novel interleaver is suitable for an IMT-2000 system in which the interleaver size of each logical channel is not expressed in terms of a power of 2 and is very large.

TABLE 3

```
36  73  172  230  317  332  33  68  165  226  286 373 16 113 146 224 318 346 55 88
184  223  302  27  123  171  207  294  365  13  149 199 290 342 6 78 138 195 288
50  118  180  193  287  364  40  106  169  192  271 357 35 100 148 239 262 338 17 97
185  215  259  8  80  156  203  257  363  51  119 189 197 256 341 25 91 158 194 303
330  12  77  190  240  279  372  53  70  174  231 267 361 26 114 166 211 261 340 60
104  162  201  258  45  99  160  196  304  348  22 81 159 241 295 58 72 143 216 275
350  44  115  135  251  265  37  89  131  221  260 366 18 76 129 206 305 358 56 117
128  246  280  354  43  90  175  234  315  352  21 124 151 228 285 351 10 109 139
225
270  335  52  86  133  208  310  327  41  122  130 247 298 323 20 108 176 219 292
321
57  101  167  205  289  320  28  82  147  198  272 367 61 120 137 243 311 343 30 107
132  232  283  331  62  85  177  227  269  325  46 74 152209 262 322 38 116 187 200
306  368  34  105  157  243  296  359  32  84  142 217 291 339 31 121 182 204 272
329
15  92  170  245  264  324  7  125  164  218  307 369 3 94 161 252 281 344 1 126
144  237  268  1  110  183  214  309  349  47  102 155 250 282 334 23 98 141 236 316
374  11  96  134  229  301  362  5  95  178  210 278 356 2 79 168 248 314 353 48
71  163  235  300  336  39  67  145  213  293  375 19 65 136 202 274 347 9 64 179
244  312  333  4  111  153  233  299  326  49  87 140 212 277 370 24 75 181 249 266
360  59  69  154  220  308  355  29  66  188  253 297 337 14 112 173 222 276 328 54
103  150  254  313  371  42  83  186  238  284  345 63 127 191 255 319
```

As described above, the present invention proposes a method for minimizing the memory capacity required for performing random interleaving while satisfying the random property, distance property and weight property for data interleaving. Further, the proposed offset controlled interleaving method has solved the problem of the existing PN interleaving method in which the interleaver size cannot be expressed in terms of a power of 2 and an increase in the interleaver size results in low memory utilization efficiency.

In the existing interleaving method, various interleaving rules for the respective interleaver sizes should be stored in the controller (CPU or host) of the transceiver so that a host memory requires a separate memory capacity in addition to the interleaver memory. However, the invention can decrease the hardware complexity by implementing an interleaver capable of enumeration. In addition, the invention proposes a very simple transmission method for the interleaver/deinterleaver and minimizes the use of memory.

That is, the novel interleaver requires an interleaver memory capacity corresponding to the frame size L. Finally, the novel interleaver satisfies all the properties of the turbo interleaver, thereby guaranteeing an average performance or over.

While the invention has been shown and described with reference to a certain preferred embodiment thereof, it will be understood by those skilled in the art that various changes in form and details may be made therein without departing from the spirit and scope of the invention as defined by the appended claims.

What is claimed is:

1. A method for interleaving input data having a size other than a multiple of $2^m$ (m>1), comprising the step of:

adding an offset value to the input data size so that a virtual address size becomes a multiple of $2^m$.

2. The method as claimed in claim 1, further comprising the steps of:

sequentially storing the input data in a memory;

defining a plurality of address generation areas each having a size of $2^m$ where (m>1) and generating random addresses in the address generation areas; and reading the input data from the memory using the random addresses generated from the address generation areas.

3. The method as claimed in claim 2, wherein the random addresses are PN (Pseudo Noise) sequences.

4. The method as claimed in claim 1, wherein the offset value is a certain value to be added to a binary value obtained by converting the input data size into the binary value, such that the number of consecutive zero bits from the least significant bit (LSB) of the binary value becomes at least more than one.

5. A method for interleaving input data having a size other than a multiple of $2^m$ (m>1), comprising the steps of:

sequentially storing input data in a memory;

adding an offset value to the input data size to provide a virtual address having a size of $2^m$ where (m>1);

defining a plurality of address generation areas each having a size of $2^m$;

generating random addresses in the address generation areas; and reading the input data from the memory using the random addresses generated from the address generation areas.

6. The method as claimed in claim 5, wherein the random addresses are PN sequences.

7. The method as claimed in claim 5, wherein the offset value is a certain value to be added to a binary value obtained by converting the input data size into the binary value, such that the number of consecutive zero bits from the least significant bit (LSB) of the binary value becomes at least more than one.

8. A device for interleaving input data having a size other than a multiple of $2^m$ (m>1), comprising:

a memory for sequentially storing input data; and an address generator for adding an offset value to the input data size to provide a virtual address having a size of $2^m$ where (m>1), defining a plurality of address generation areas each having a size of $2^m$ where (m>1), and generating random addresses in the address generation areas;

wherein the input data is read from the memory using the random addresses generated from the address generation areas.

9. The device as claimed in claim 8, wherein the random addresses are generated by a PN generator.

10. The device as claimed in claim 8, wherein the offset value is a certain value to be added to a binary value obtained by converting the input data size into the binary value, such that the number of consecutive zero bits from the least significant bit (LSB) of the binary value becomes at least more than one.

11. The device as claimed in claim 8, wherein the address generator uses the last addresses of the address generation areas as the read address.

12. The device as claimed in claim 8, wherein the address generator comprises:

a random address generator having a plurality of PN generators each generating random addresses corresponding to the address generation areas;

a comparator for dividing the virtual address area into a plurality of groups according to the addresses corresponding to the offset value, and determining to which group a random address from the random address generator belongs; and an operator for subtracting a specific value corresponding to the group determined by the comparator from the random address provided from the random address generator, to generate the read address.

13. The device as claimed in claim 12, wherein the PN generators each have different initial state values.

14. The device as claimed in claim 8, wherein the address generator comprises:

a plurality of PN generators for generating random addresses corresponding to the respective address generation areas;

a counter for generating a select signal for selecting one of the PN generators;

a selector for selecting a state value of a selected one of the PN generators according to the select signal output from the counter; and an address buffer for assembling the read address by combining bits corresponding to the select signal from the counter and bits output from the selector.

15. The device as claimed in claim 14, wherein the PN generators have different initial values.

16. The device as claimed in claim 14, wherein the counter outputs the select signal for sequentially selecting the PN generators.

17. The device as claimed in claim 16, wherein the counter monitors the last PN generator, and does not select, when a state value of the last PN generator corresponds to the offset value, the last PN generator to select the next PN generators.

18. The device as claimed in claim 14, wherein the counter outputs the select signal for selecting the PN generators at random.

19. The device as claimed in claim 18, wherein the counter monitors the last PN generator, and skips, when a state value of the last PN generator corresponds to the offset value, the last PN generator to select the next PN generators.

20. A turbo encoding device comprising:

a first component encoder for encoding input data;

an interleaver for sequentially storing the input data in a memory, adding an offset value to a size of the input data so that a virtual address size becomes multiples of $2^m$ where (m>1), defining a plurality of address generation areas each having a size of $2^m$ where (m>1), generating random addresses in the address generation areas, and reading the input data from the memory using the random address generated from the address generation areas; and a second component encoder for encoding the data read from the interleaver.

21. The turbo encoding device as claimed in claim 20, wherein the offset value is a certain value to be added to a binary value obtained by converting the input data size into the binary value, such that the number of consecutive zero bits from the least significant bit (LSB) of the binary value becomes at least more than one.

* * * * *